(12) United States Patent
Jin et al.

(10) Patent No.: US 11,393,889 B2
(45) Date of Patent: Jul. 19, 2022

(54) FLEXIBLE DISPLAY PANEL AND DISPLAY DEVICE

(71) Applicant: Xiamen Tianma Micro-Electronics Co., Ltd, Xiamen (CN)

(72) Inventors: Jian Jin, Xiamen (CN); Congyi Su, Xiamen (CN)

(73) Assignee: XIAMEN TIANMA MICRO-ELECTRONICS CO., LTD, Xiamen (CN)

( * ) Notice: Subject to any disclaimer, the term of this patent is extended or adjusted under 35 U.S.C. 154(b) by 0 days.

(21) Appl. No.: 16/460,837

(22) Filed: Jul. 2, 2019

(65) Prior Publication Data
US 2020/0203458 A1   Jun. 25, 2020

(30) Foreign Application Priority Data

Dec. 25, 2018   (CN) .......................... 201811587799.3

(51) Int. Cl.
*H01L 27/32* (2006.01)
*H01L 25/04* (2014.01)
*H01L 51/52* (2006.01)

(52) U.S. Cl.
CPC ........ *H01L 27/3267* (2013.01); *H01L 25/048* (2013.01); *H01L 27/3258* (2013.01);
(Continued)

(58) Field of Classification Search
None
See application file for complete search history.

(56) References Cited

U.S. PATENT DOCUMENTS

| 2004/0207569 A1* | 10/2004 | Ho | H04M 1/0245 345/1.1 |
| 2007/0035473 A1* | 2/2007 | Yamazaki | G09G 5/18 345/4 |

(Continued)

FOREIGN PATENT DOCUMENTS

| CN | 102593095 A | 7/2012 |
| CN | 104950535 A | 9/2015 |

(Continued)

OTHER PUBLICATIONS

First Office Action, dated Jul. 9, 2020, issued in corresponding Chinese Application No. 201811587799.3, filed Feb. 25, 2018, 18 pages.

(Continued)

*Primary Examiner* — Khaja Ahmad
(74) *Attorney, Agent, or Firm* — Christensen O'Connor Johnson Kindness PLLC

(57) ABSTRACT

A flexible display panel and a display device are provided. The display panel includes: a first display zone; a second display zone; and a non-display zone located between the first display zone and the second display zone. After the flexible display panel is bent along a folding axis extending along a first direction defined in the non-display zone, a light-emitting surface of the first display zone and a light-emitting surface of the second display zone face away from each other. The first display zone has a first hollow zone close to the non-display zone. The second display zone has a second hollow zone close to the non-display zone. By providing two mutually independent display zones on the same flexible substrate and providing a hollow portion on each display zone, a screen occupancy ratio of the two display zones will be high, and a "full screen" is realized.

15 Claims, 12 Drawing Sheets

(52) U.S. Cl.
CPC ...... H01L 27/3272 (2013.01); H01L 27/3276 (2013.01); H01L 51/5237 (2013.01); *H01L 2251/5338* (2013.01)

(56) References Cited

U.S. PATENT DOCUMENTS

| | | | | |
|---|---|---|---|---|
| 2014/0049449 | A1* | 2/2014 | Park | G09G 5/00 345/1.3 |
| 2014/0217373 | A1* | 8/2014 | Youn | H01L 51/5203 438/23 |
| 2014/0232956 | A1* | 8/2014 | Kwon | H01L 27/3276 349/12 |
| 2014/0306985 | A1* | 10/2014 | Jeong | G09G 3/035 345/600 |
| 2015/0109544 | A1* | 4/2015 | Yeo | H01L 27/3276 349/12 |
| 2016/0147362 | A1* | 5/2016 | Eim | G06F 1/1652 345/173 |
| 2017/0102738 | A1* | 4/2017 | Park | G06F 1/1626 |
| 2017/0118853 | A1* | 4/2017 | Lee | G09F 9/301 |
| 2017/0206049 | A1* | 7/2017 | Choi | G06F 1/1652 |
| 2017/0263690 | A1* | 9/2017 | Lee | G02F 1/1368 |
| 2018/0082632 | A1* | 3/2018 | Lee | G09G 3/3233 |
| 2018/0122863 | A1* | 5/2018 | Bok | H01L 27/3225 |
| 2018/0175311 | A1* | 6/2018 | Jin | H01L 27/3258 |
| 2019/0018454 | A1* | 1/2019 | Jung | G06F 1/1652 |
| 2019/0363266 | A1* | 11/2019 | Tanaka | H01L 51/56 |

FOREIGN PATENT DOCUMENTS

| | | |
|---|---|---|
| CN | 107633807 A | 1/2018 |
| CN | 108366148 A | 8/2018 |

OTHER PUBLICATIONS

Second Office Action, dated Mar. 25, 2021, issued in corresponding Chinese Application No. 201811587799.3, filed Dec. 25, 2018, 18 pages.

* cited by examiner

FLEXIBLE DISPLAY PANEL AND DISPLAY DEVICE

CROSS-REFERENCE TO RELATED APPLICATIONS

The present application claims priority to Chinese Patent Application No. 201811587799.3, filed on Dec. 25, 2018, the content of which is incorporated herein by reference in its entirety.

TECHNICAL FIELD

The present disclosure relates to the field of display technologies, and in particular, to a flexible display panel and a display device.

BACKGROUND

With the rapid development of the flat panel display technology, an organic light emitting display (OLED) is widely used due to its excellent characteristics such as self-luminous, high brightness, wide viewing angle and fast response.

In the past two years, with the continuous promotion and popularization of the product concept of "bendable" and "foldable", in the design of OLED display product, the way to achieve better folding performance of the flexible display without affecting the display function and service life of the flexible display has become a very important topic in current OLED flexible technology.

SUMMARY

In view of this, an embodiment of the present disclosure provides a flexible display panel and a display device, by providing two mutually independent display zones on the same flexible substrate and by providing a hollow portion on each display zone. As a result, a screen occupancy ratio of the two display zones will be high, and a "full screen" is realized.

In one aspect, an embodiment of the present disclosure provides a display panel, including a first display zone; a second display zone; and a non-display zone located between the first display zone and the second display zone. After the flexible display panel is bent along a folding axis extending along a first direction defined in the non-display zone, a light-emitting surface of the first display zone and a light-emitting surface of the second display zone face away from each other. The first display zone has a first hollow zone close to the non-display zone. The second display zone has a second hollow zone close to the non-display zone.

In another aspect, an embodiment of the present disclosure provides a flexible display device, and the flexible display device includes any display panel described in the present disclosure.

In the flexible display panel and the display device provided by an embodiment of the present disclosure, by providing a hollow zone on both the first display zone and the second display zone, the occupancy ratio of the non-display zones of these two zones is reduced, thereby increasing the occupancy ratio of the effective display zone and achieving a double-sided full screen. In addition, in order to further enhance the bending resistance of the flexible display panel, multiple bending-resistant portions are provided in the non-display zone and the bending-resistant portions may be formed in synchronization with the metal routing lines, the organic film layer or/and the inorganic film layer in the first display zone and the second display zone, so that the manufacturing process steps of the bending-resistant portions can be greatly reduced.

BRIEF DESCRIPTION OF DRAWINGS

In order to illustrate technical solutions of embodiments of the present disclosure, the accompanying drawings used in the embodiments are briefly described below. The drawings described below are merely a part of the embodiments of the present disclosure. Other embodiments are also possible.

DESCRIPTION OF EMBODIMENTS

Figure 1:
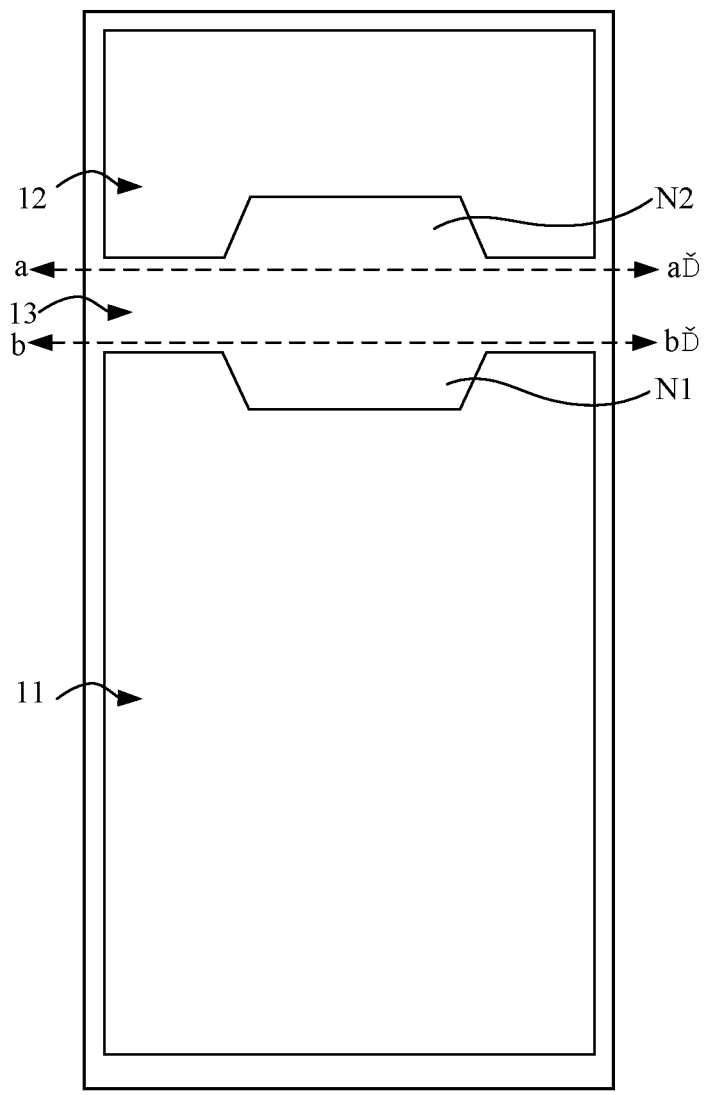
FIG. 1 illustrates a structural schematic diagram of a display panel according to an embodiment of the present disclosure.

For a better understanding of the technical solutions of the present disclosure, the embodiments of the present disclosure are described in detail below with reference to the accompanying drawings.

It should be noted that the described embodiments are merely some embodiments of the present disclosure, but not all of the embodiments. Other embodiments obtained by those skilled in the art based on the embodiments of the present disclosure are within the protection scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

It should be understood that the term "and/or" as used herein merely indicates an association relationship to describe the associated object, meaning that there may be three relationships, for example, A and/or B may indicate three cases: A exists individually; A and B exist simultaneously; B exists individually. In addition, the character "/" as used herein generally indicates that the contextual associated objects are in an "or" relationship.

In the description of the present specification, it is to be understood that the terms "substantially", "approximately", "roughly", "about", "basically", "generally", and the like as used in the claims and embodiments of the present disclosure means that it can be generally accepted within a reasonable process operation or within the tolerance range, rather than an exact value.

It should be understood that although the terms first, second, third, etc. may be used to describe the display zones in the embodiments of the present disclosure, these display zones should not be limited to these terms. These terms are only used to distinguish display zones from each other. For example, the first display zone may also be referred to as a second display zone and, similarly, the second display zone may also be referred to as a first display zone without departing from the scope of the embodiments of the present disclosure.

The applicant of this disclosure provided solutions to the problems existing in the related art through careful and in-depth research. As shown from FIG. 1 to FIG. 19, the present disclosure provides a display panel and a display device, by providing two mutually independent display zones on the same flexible substrate and providing a hollow portion on each display zone, a screen occupancy ratio of the two display zones will be higher, and a "full screen" is realized.

The display panel includes: a first display zone; a second display zone; and a non-display zone. The non-display zone is located between the first display zone and the second display zone.

After the display panel is bent along a folding axis of the non-display zone, a light emitting surface of the first display zone is facing away from a light emitting surface of the second display zone, and the folding axis extends in the first direction.

On a side close to the non-display zone, the first display zone has a first hollow zone.

On a side close to the non-display zone, the second display zone has a second hollow zone.

As shown from FIG. 1 to FIG. 19, an embodiment of the present disclosure provides a display panel 1, which may be a flexible bendable display panel. In the flexible display panel, a first display zone 11, a second display zone 12, and a non-display zone 13 between these two are formed on the same flexible substrate 100. The first display zone 11 and the second display zone 12 are connected by the non-display zone 13 and are also supported by the non-display zone 13.

The folding state of the display panel 1 is achieved after the first display zone 11 and the second display zone 12 are folded.

Figure 2:
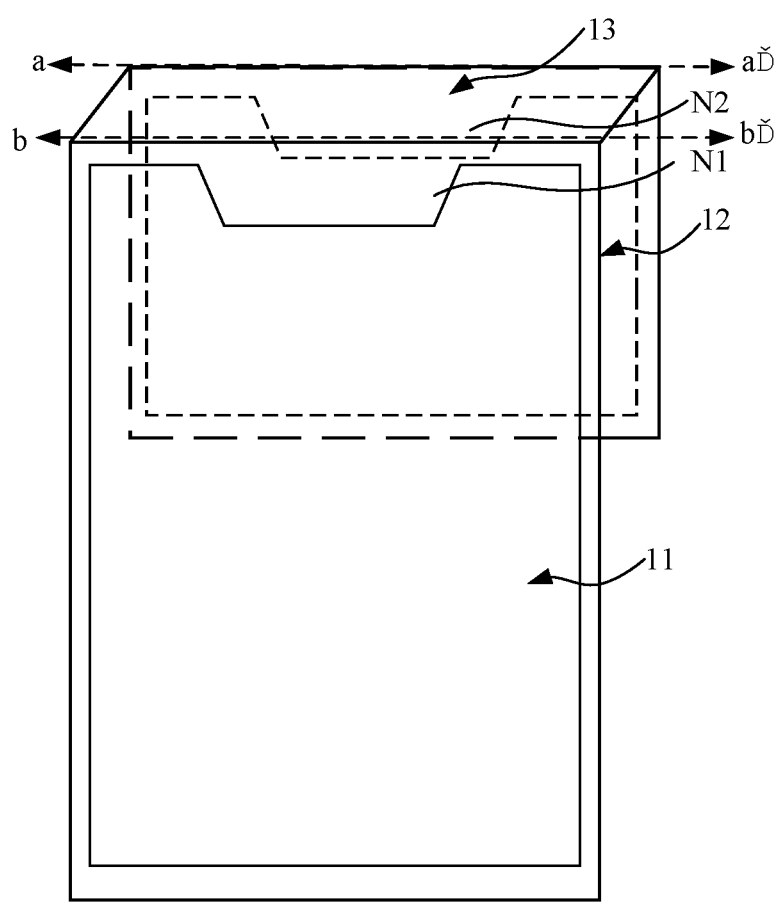
FIG. 2 illustrates a schematic diagram of the display panel of FIG. 1 in a bending state.
Figure 3:
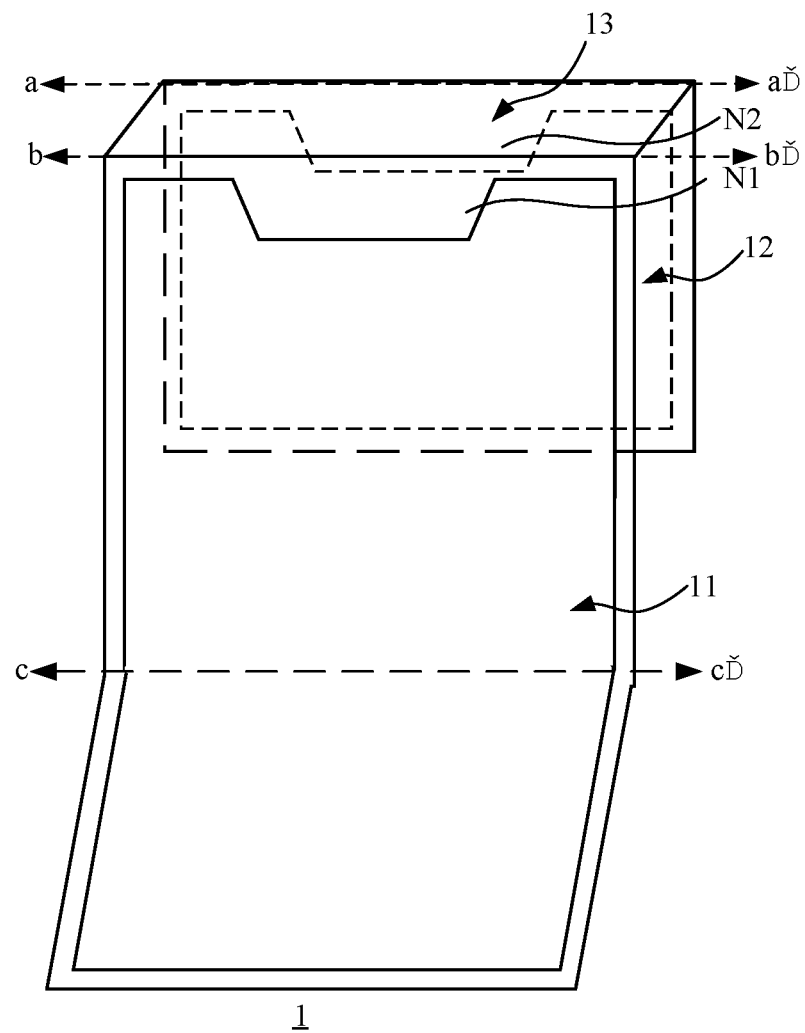
FIG. 3 illustrates another schematic diagram of the display panel of FIG. 1 in a bending state.

With reference to FIG. 1 to FIG. 3, a bending axis is defined in the non-display zone 13. In the present disclosure, the bending axis may include a first folding axis bb' and a second folding axis aa' which both extend in the first direction (i.e., a width direction of the display panel 1) and are parallel to each other. When the first display zone 11 is bent along the first folding axis bb'; after the second display zone 12 is bent along the second folding axis aa', as shown in FIG. 3, the light emitting surface of the first display zone 11 is disposed to be facing away from the light emitting surface of the second display zone 12. That is, as for the display device adopting this display panel, it can be realized that there is one display screen on the front side and one display screen on the back side. In the present embodiment, the two display zones may be controlled by mutually independent processing chips. Alternatively, the two display zones may be simultaneously controlled by a same processing chip to realize respective display images. It should be noted that the first folding axis bb' and the second folding axis aa' are not physically existing components, but are virtual line segments along which the first display zone 11 and the second display zone 12 are respectively folded. Or artificially, the intersections of the non-display zone 13 with the edge of the first display zone 11 and/or the second display zone 12 are respectively referred as the first folding axis bb' and the second folding axis aa', which are actually two preset regions in the non-display zone 13. Further, with regarding to the first folding axis bb' and the second folding axis aa', they can overlap with each other, for example, they are located at the centerline position of the non-display zone 13.

Figure 4:
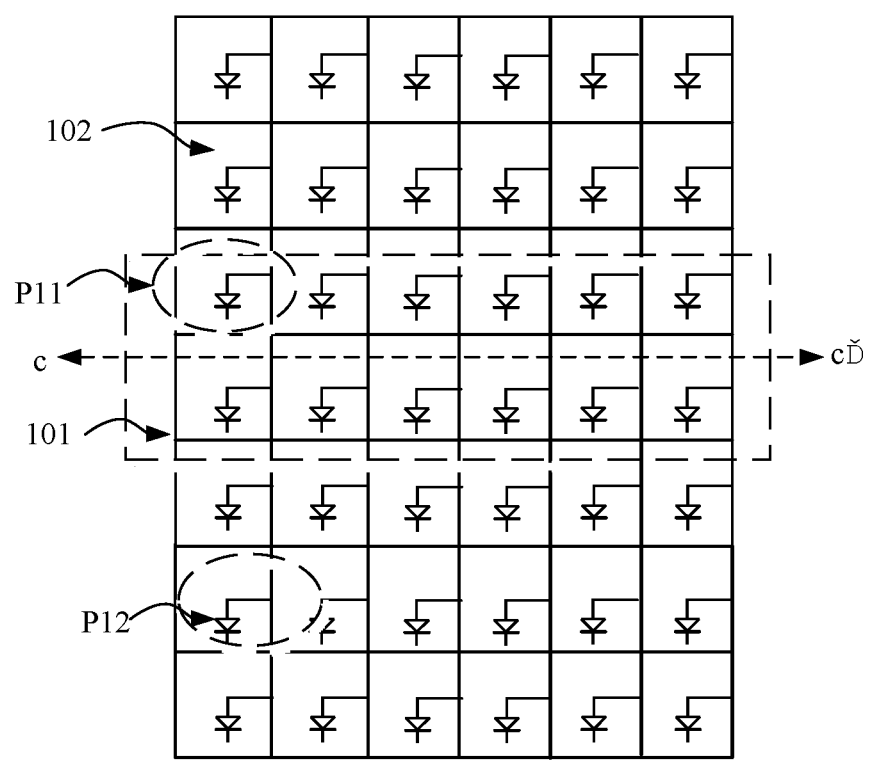
FIG. 4 illustrates a structural schematic diagram of a first display zone 11 of FIG. 1.

With reference to FIG. 3 and FIG. 4, FIG. 3 illustrates another schematic diagram of the display panel of FIG. 1 in a bending state; FIG. 4 illustrates a structural schematic diagram of the first display zone 11 in FIG. 1. For the first display zone 11, it is also possible to perform secondary folding or bending. The first display zone 11 has a virtual folding axis cc' extending in the first direction, and the first display zone 11 can be bent along the virtual folding axis cc' to achieve an in-fold state, an out-fold state, or a tiled state. Here, the first display zone 11 may include a non-bending zone 102 and a bending zone 101. Here, the bending zone 101 means that the first display zone 11 can be bent at different angles along the virtual folding axis cc'. For example, a complete symmetrical folding along the virtual folding axis cc' achieves a size of the first display zone 11 that is reduced to half of the size in the unfolded state. Of course, the first display zone 11 can also be folded along a virtual folding axis cc' according to a folding mechanism (not shown), and the bending zone 101 in the folding state presents an arc structure. In the embodiment of the present disclosure, the first display zone 11 can be folded in a direction towards the screen display image, which is referred to as "in-fold"; it is also possible to be folded in a direction facing away from the screen display image, which is referred to as "out-fold". Further, the bending radius of the first display zone 11 along the virtual folding axis cc' may be larger than or equal to 1 mm.

It should be noted that the virtual folding axis cc' is not a physically existing component, and is a virtual line segment along which the first display zone 11 is folded. Or artificially, a region in the bending zone 101 is referred to as a virtual folding axis cc', which is actually a preset display region in the first display zone. In addition, the virtual folding axis cc' may be located at the centerline position of the bending zone 101, and the first display zone 11 may be symmetrically bent or folded along the virtual folding axis cc'.

In addition, as shown in FIG. 4, the first display zone 11 includes a bending zone 101 and a non-bending zone 102, and multiple first pixels P11 are included in the bending zone 101. The first display zone 11 further includes multiple second pixel units P12 in the non-bending zone 102. That is, an image can be normally displayed in the bending zone 101 as in the non-bending zone 102. In addition, the reason why the display panel in the embodiments of the present disclosure can be folded or bent lies in that in the embodiments of the present disclosure, the flexible substrate 110 used in the display panel 1, such as a high polymer material substrate, enables that the display panel can realize the bendable state.

With reference to FIG. 1 to FIG. 3, in the embodiments of the present disclosure, when the display panel 1 is assembled into a display device, such as a mobile phone, at the time when the user uses the display device, the display functions of the first display zone 11 and the second display zone 12 are different. In a specific implementation, an area of the first display zone 11 is larger than an area of the second display zone 12. The first display zone 11 is used as a main display screen for displaying a main interface currently operated by the user, such as a picture display, an APP software display, and the like. The second display zone 12 is used as a secondary display screen so as to be able to present various status information of the mobile phone, such as current time, weather, push information, and the like to the user. The second display zone 12 can always be in the display state, so that the user can view the corresponding information at any time. Due to the difference of the display function settings of the first display zone 11 and the second display zone 12, the first display zone 11 and the second display zone 12 may be provided with different pixels resolution in one embodiment of the present disclosure. The display resolution of the second display zone 12 may be lower than the display resolution of the first display zone 11, that is, the number of pixel units P21 of the second display zone 12 may be less than the number of pixel units P11/P12 of the first display zone 11 per unit area.

Figure 13:
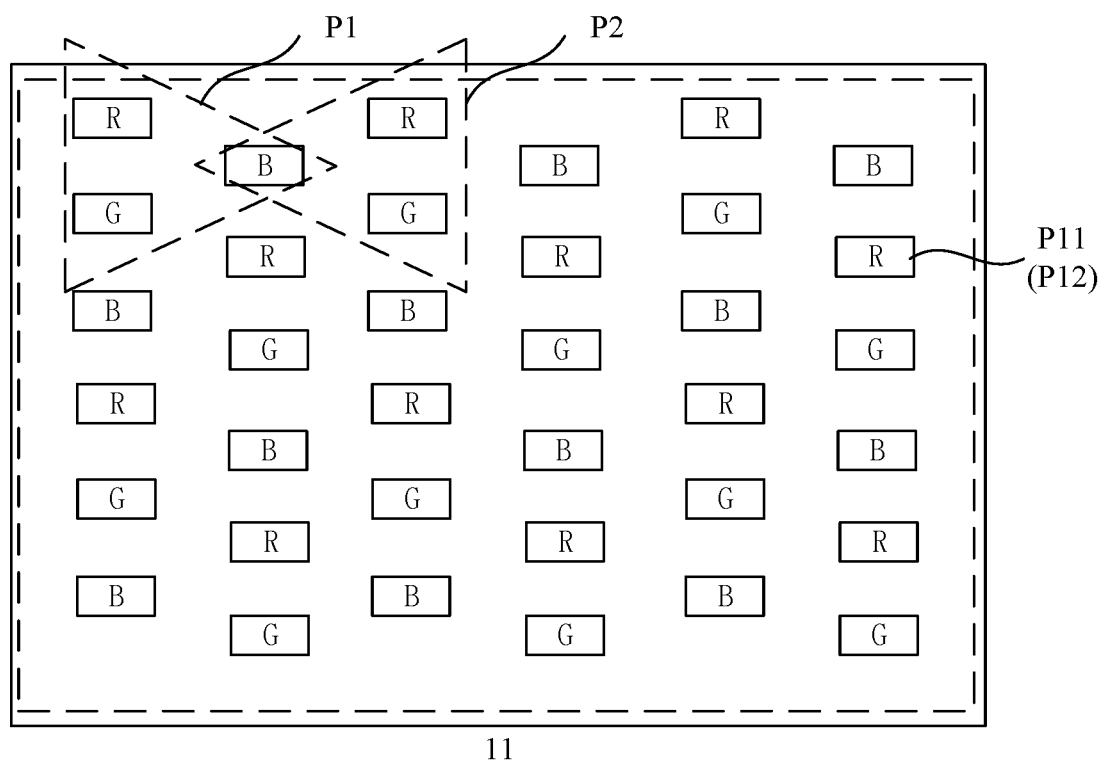
FIG. 13 illustrates a schematic diagram showing an arrangement of pixels of the first display zone 11 of FIG. 1.

As shown in FIG. 4 and FIG. 13 to FIG. 15, the first display zone 11 and the second display zone 12 respectively include multiple first pixel units P11, second pixel units P12, and pixel units P21. Here, it should be noted that in FIG. 4 and FIG. 14, the arrangement of the pixel driving circuits in the first display zone 11 and the second display zone 12 is presented, and in the present disclosure, the pixel driving circuits may be arranged in a matrix. In the embodiments of the present disclosure, a specific arrangement of the light emitting units of the pixel units in the first display zone 11 and the second display zone 12 can be referred to FIG. 13 and FIG. 15. In a specific implementation of the present technology, the arrangement of the pixel units of the second display zone 12 is different from the arrangement of the pixel units of the first display zone 11. As shown in FIG. 13, multiple pixel units P11 (P12) in the first display zone 11 may include a red pixel unit R emitting red light, a green pixel unit G emitting green light and a blue pixel unit B emitting blue light. Here, a first pixel unit group P1 or a second pixel unit group P2 is composed of one red pixel unit R, one green pixel unit G and one blue pixel unit B which are adjacent to each other. The arrangement of the pixel units in the first display zone 11 in one implementation of the present disclosure can be shown in FIG. 13, and in one pixel unit group, the red pixel unit R, the green pixel unit G and the blue pixel unit B may be arranged in a "triangular shape" or a "π shape". In addition, the pixel unit resolution can be improved by sharing the pixel unit and combining the pixel rendering algorithm. For example, as shown in FIG. 13, with regarding to the two adjacent pixel unit groups of the first pixel unit group P1 (dashed line portion in the drawing) and the second pixel unit group P2 (dashed line portion in the drawing), they can share the blue pixel unit B and the pixel rendering mode, thereby being perceived as two independent pixel unit groups by the human eye.

Figure 14:
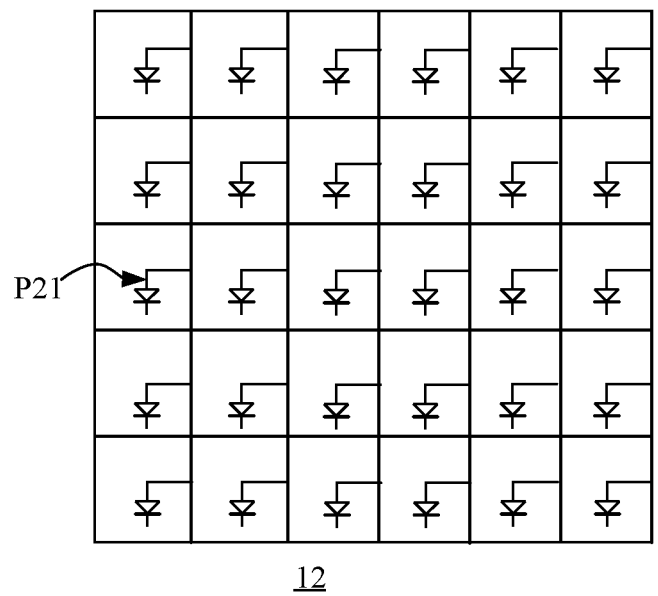
FIG. 14 illustrates a structural schematic diagram of a second display zone 12 of FIG. 1.
Figure 15:
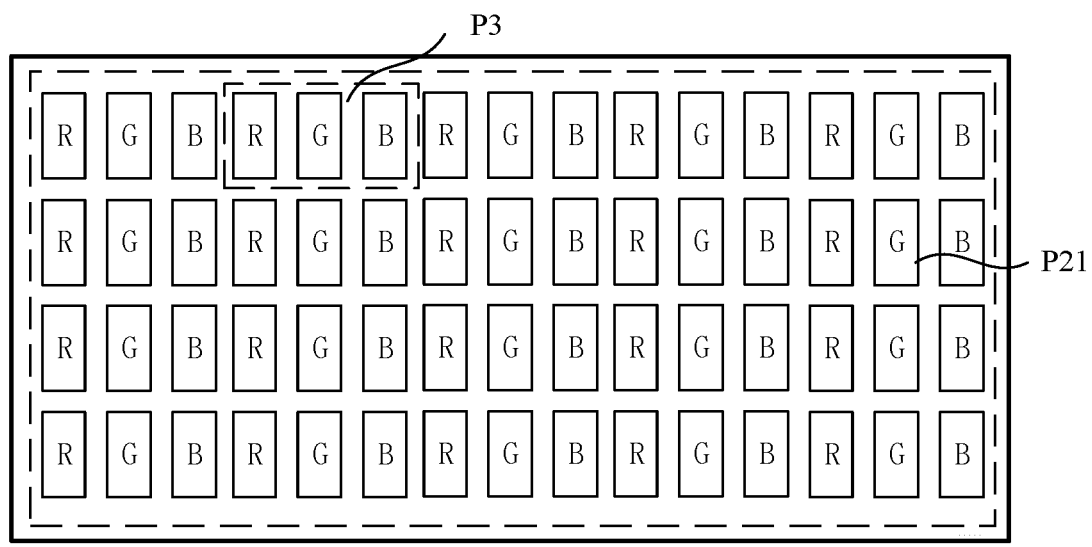
FIG. 15 illustrates a schematic diagram showing an arrangement of pixels of the second display zone 12 of FIG. 1.

The arrangement of the pixel units in the second display zone 12 is different from the arrangement of the pixel units in the first display zone 11. As shown in FIG. 14 and FIG. 15, multiple pixel units P21 in the second display zone 12 may include a red pixel unit R emitting red light, a green pixel unit G emitting green light and a blue pixel unit B emitting blue light. The third pixel unit group P3 is composed of one red pixel unit R, one green pixel unit G and one blue pixel unit B which are adjacent to each other. The arrangement of the pixel units in the second display zone 12 can be shown in FIG. 15 in one implementation of the present disclosure, and in one pixel unit group, the red pixel unit R, the green pixel unit G and the blue pixel unit B are located in the same row in a first direction and constitutes one third pixel unit group P3. Each of the third pixel unit groups P3 independently includes a red pixel unit R, a green pixel unit G and a blue pixel unit B among which there is no shared pixel unit, and during the display process, no pixel rendering algorithm is necessary. Since the resolution requirement for the second display zone 12 is not high, such a pixel unit arrangement can be adopted to reduce the computing power requirement for the processing chip.

As described above, in a specific implementation of the present disclosure, by differentiating the pixel resolutions of the first display zone 11 and the second display zone 12, different display functions thereof are realized. Meanwhile, since the number of the pixel units per unit area in the second display zone 12 is reduced as compared with the number of the pixel units per unit area in the first display zone 11, the overall power consumption of the display panel 1 can be reduced.

Figure 16:
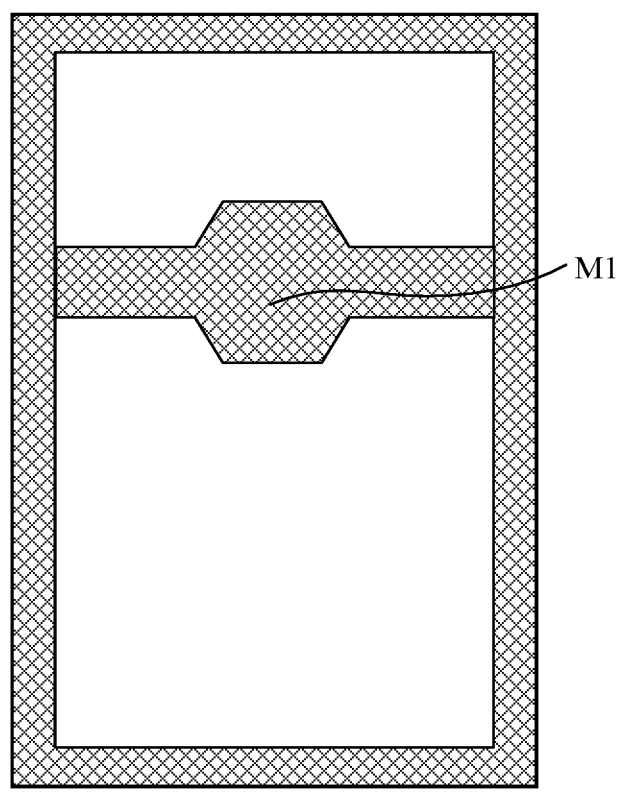
FIG. 16 illustrates a mask used in a process of preparing the display panel 1.

As shown in FIG. 1 to FIG. 3, in order to improve the effective display zone of the first display zone 11 and the second display zone 12, in a specific implementation of the present disclosure, on a side close to the non-display zone 13, the first display zone 11 and the second display zone 12 respectively have a first hollow zone N1 and a second hollow zone N2. Here, the first hollow zone N1 and the second hollow zone N2 are both regions having no display function. Therefore, at least one of the light sensor, the distance sensor, the camera, the receiver, the depth sensor, and the iris recognition sensor can be provided in the first hollow zone N1 and/or the second hollow zone N2, thereby saving the area of the non-display zone. In addition, since the first display zone 11 and the second display zone 12 are formed on the same flexible substrate 110, the first hollow zone N1 and the second hollow zone N2 may be implemented by the same process in a specific implementation of the present disclosure. As shown in FIG. 16, the hollow zones can be formed by a vapor deposition manner during the vapor deposition process. After the driving array on the flexible substrate 110 has been prepared, when a corresponding light emitting unit is prepared by vapor deposition on each pixel driving circuit, the preset regions of the first display zone 11 and the second display zone 12 may be shielded, so as to prevent the organic luminescent material from vapor-depositing on the preset region, thereby forming the corresponding first hollow zone N1 and second hollow zone N2. Here, an opening mask 2 is used to realize the above process. The opening mask 2 includes a first shielding portion M1, and the first shielding portion M1 has the same pattern as the first hollow zone N1 and the second hollow zone N2. Meanwhile, in the embodiments of the present disclosure, the organic light-emitting material is prevented from being vapor-deposited in the non-display zone 13 by the shielding effect of the first shielding portion M1.

Figure 17:
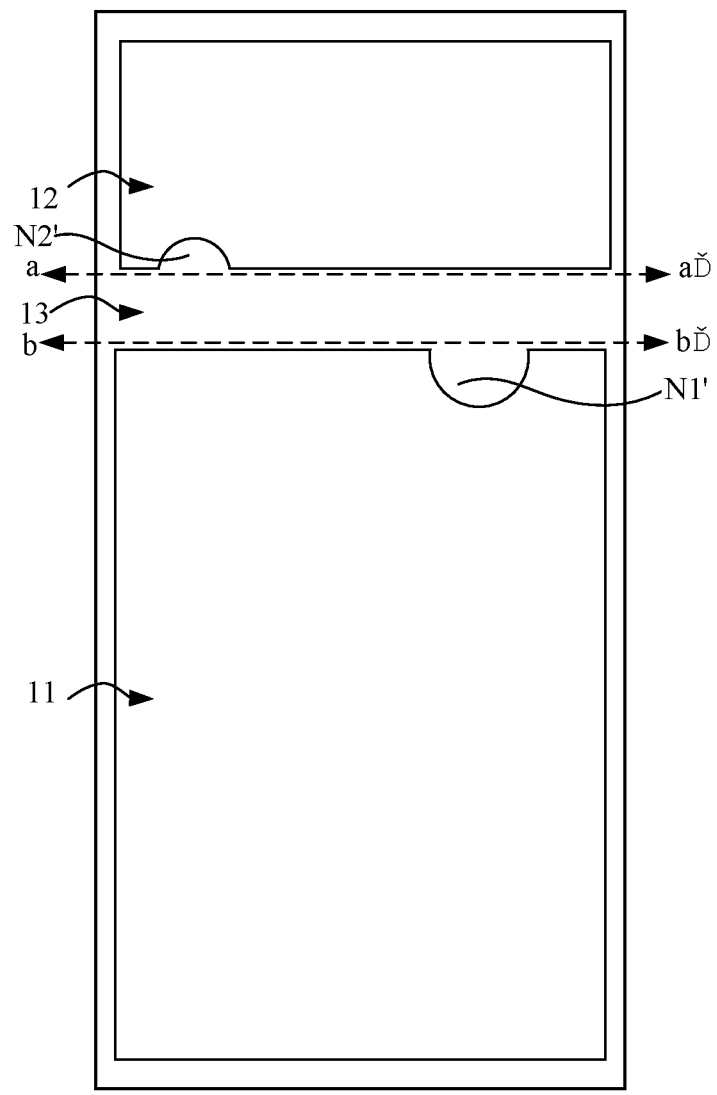
FIG. 17 illustrates a structural schematic diagram of still another display panel according to an embodiment of the present disclosure.
Figure 18:
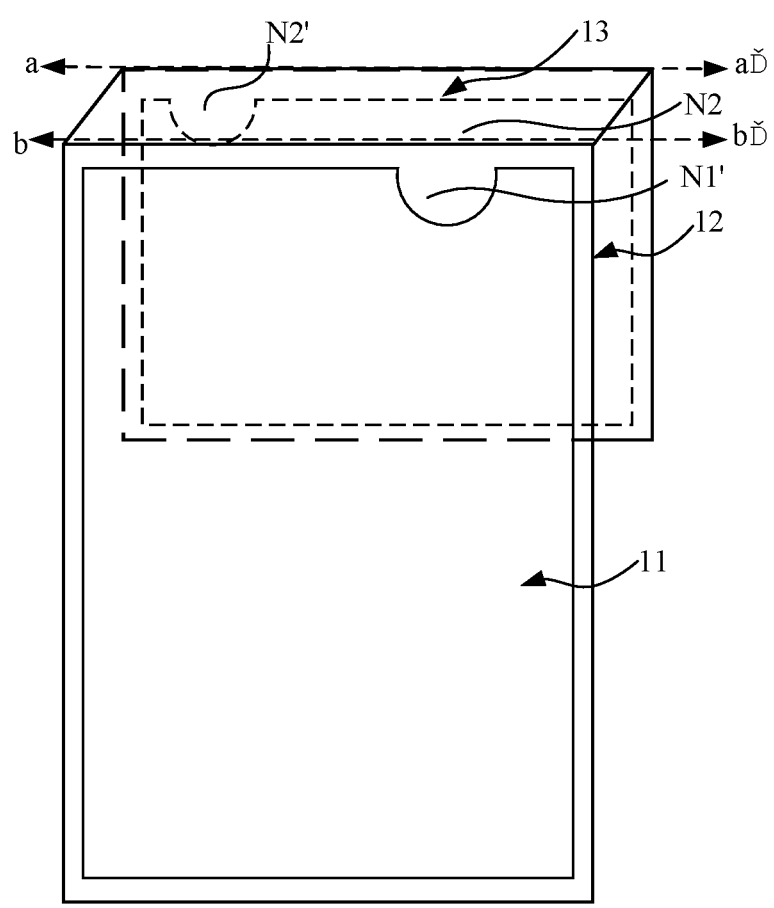
FIG. 18 illustrates a schematic diagram showing the display panel of FIG. 17 in a bending state.

With reference to FIG. 1 to FIG. 3, in a specific implementation of the present disclosure, the first hollow zone N1 and the second hollow zone N2 may be configured to be mirror-symmetrical, and their respective opening areas are equal. Thereby, the first hollow zone N1 and the second hollow zone N2 can be formed by the mask 2 as shown in FIG. 16. In the production process, it is relatively simple and easy. In still another implementation of the present disclosure, as shown in FIGS. 17 to 18, the first display zone 11 and the second display zone 12 of the display panel 1 respectively include a third hollow zone N1' and a fourth hollow zone N2' which are asymmetrically arranged. The third hollow zone N1' may be provided in a right border area close to the first display zone 11, the fourth hollow zone N2' may be provided in a left border area close to the second display zone 12, and they are provided to be away from each other. Further, in the present implementation, the third hollow zone N1' and the fourth hollow zone N2' may have the same shape, such as a semicircular shape, a teardrop shape, an arc shape, a triangle shape, or a rectangular shape. It is also possible to have different shapes without specific limitation.

In a specific implementation of the present disclosure, in order to improve the bending resistance performance of the display panel 1, in the non-display zone 13 where the bending axis is defined, a bending-resistant portion 131 is additionally provided, as shown in FIGS. 5 to 8. In the non-display zone 13, multiple bending-resistant portions 131 parallel to each other are provided in the first direction, that is, in the extending direction of the bending axis. In order to further increase the bending resistance performance of the bending-resistant portion 131, each of the bending-resistant portions 131 extends in a second direction in the implementation of the present disclosure, while the second direction is substantially perpendicular to the first direction.

Figure 6:
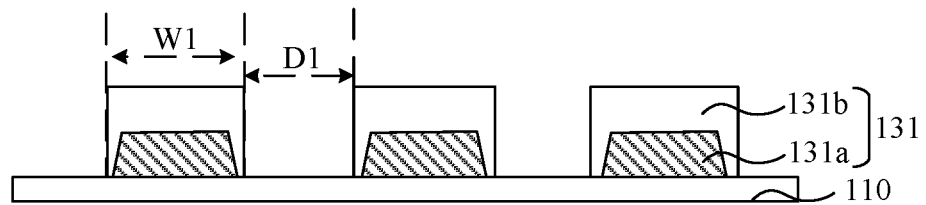
FIG. 6 illustrates a schematic cross-sectional diagram of FIG. 1 taken along line 33'.

For a specific arrangement manner of multiple bending-resistant portions 131, in one specific implementation of the present disclosure, in order to enhance the mechanical strength of the non-display zone 13 while reducing internal stress, a spacing D1 between any two of the bending-resistant portions 131 may be set substantially equal to a width of the bending-resistant portion 131. As shown in FIG. 6, each of the bending-resistant portions 131 has a first width W1, and the first width W1 may be 1 μm to 100 μm (including the end point value). If the width of the bending-resistant portion 131 is too wide, and if it is larger than 100 μm, a large internal stress may be generated. While larger stress cannot be absorbed by the non-display zone itself, the bending performance of the display panel 1 may be affected. Meanwhile, since the bending-resistant portion 131 includes a metal portion patterned by a metal layer, if the width thereof is greater than 100 μm, it has a strong reflection to the external light or the light emitted by itself, which interferes with the normal display function of the display panel. In addition, a first spacing D1 between any two of the bending-resistant portions 131 and the first spacing D1 may be 1 μm to 10 μm (including the end point value). That is, in one specific implementation of the present disclosure, the first spacing D1 and the first width W1 may be substantially equal, for example, the first spacing D1 is about 10 μm and the first width W1 is about 10 μm. Thus, it is not only possible to provide a reasonable number of bend-resistant portions 131 in the non-display zone 13 to increase the mechanical strength of the non-display zone 13, but also no excessive internal stress is generated therefrom.

With reference to FIG. 5 to FIG. 8, in a specific implementation of the present disclosure, the specific structure of the bending-resistant portion 131 can be as shown in FIG. 6. Each of the bending-resistant portions 131 includes a metal portion 131a and an organic buffer portion 131b covering the metal portion 131a. The metal portion 131a has good ductility and bending resistance, and it may be a single metal layer (which may be an elemental metal layer) or a composite metal layer, such as a Ti—Al—Ti composite metal layer; since corresponding internal stress will be generated when the metal portion 131a is bent, the organic buffer portion 131b, which covers the metal portion 131a and has a larger thickness than the metal portion 131a, is provided in the present technology in order to absorb the internal stress generated. In one embodiment, the thickness of the organic buffer portion 131b may be 3 to 20 times of the thickness of the metal portion 131a.

In addition, in order to save corresponding process steps, in a specific implementation of the present disclosure, the metal portion 131a and the organic buffer portion 131b provided in the non-display zone 13 may be formed by the same process as the functional film layer or the metal signal line layer in the first display zone 11/the second display zone 12.

Figure 5:
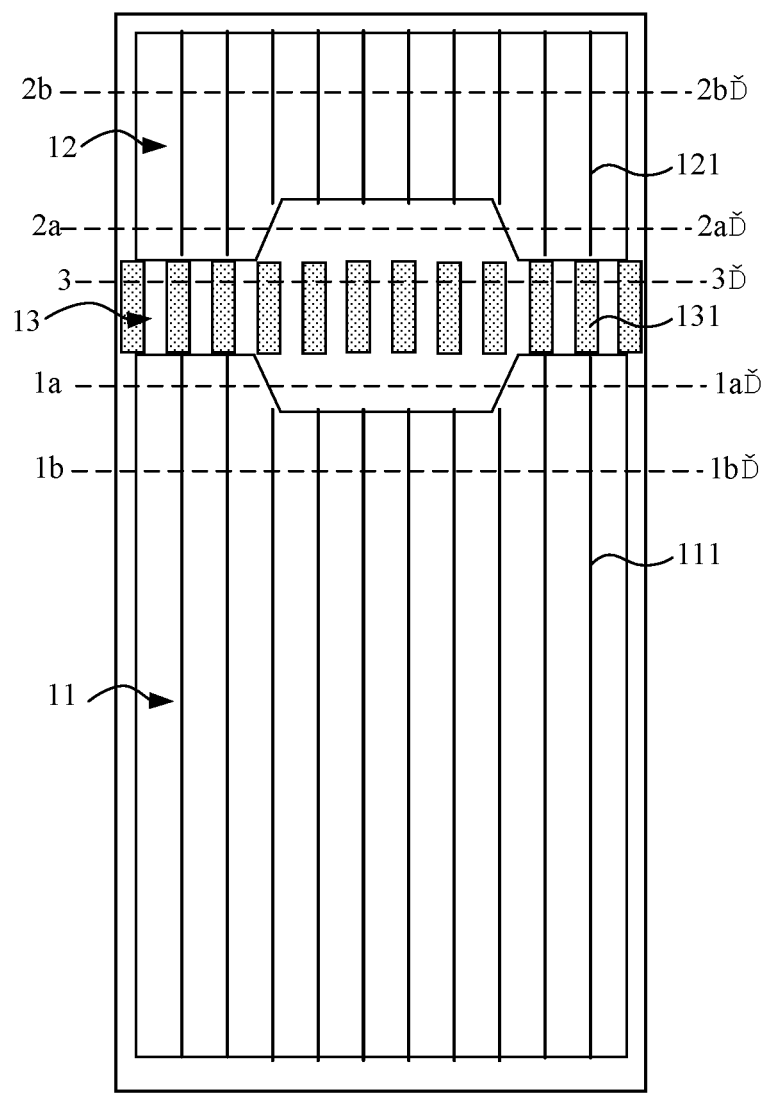
FIG. 5 illustrates another schematic diagram of the display panel of FIG. 1.

With reference to FIG. 5 to FIG. 8, the display panel 1 further includes a first metal layer. The first metal layer is patterned to form a first metal signal line 111 located in the first display zone 11, a second metal signal line 121 located in the second display zone 12, and a metal portion 131a. These three metal lines/portion are electrically insulated from each other. The metal portion 131a, the first metal signal line 111 and the second metal signal line 121 have the same thickness. As shown in FIG. 5, in the first display zone 11, the first metal signal line 111 provides a driving signal to the first display zone 11; in the second display zone 12, the second metal signal line 121 provides a driving signal to the second display zone 12. In a specific implementation manner of the present disclosure, the first metal signal line 111 may be a first gate metal signal line in the first display zone 11, for example, a Ti—Al—Ti composite metal layer may be adopted, so that the first metal signal line 111 can be formed in the same layer as the gate layer in the driving transistor 113 in the first display zone 11. The second metal signal line 121 may be a second gate metal signal line in the second display zone 12, for example, a Ti—Al—Ti composite metal layer may be adopted, so that the second metal signal line 121 can be formed in the same layer as the gate layer in the driving transistor 123 in the second display zone 12.

With reference to FIGS. 5-8, the display panel 1 further includes an organic planarization layer. The organic planarization layer is patterned to form a first organic planarization portion 112, which covers the first metal signal line 111, of the first display zone 11; a second organic planarization portion 122, which covers the second metal signal line 121, of the second display zone 12; and an organic buffer portion 131b.

Figure 7:
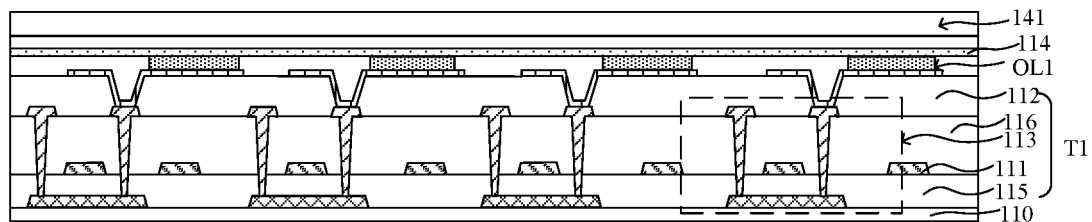
FIG. 7 illustrates a schematic cross-sectional diagram of FIG. 1 taken along line 1b-1b'.

For the specific structure of the first display zone 11, as shown in FIG. 7, having a TFT driving array layer T1, multiple light emitting devices OL1 are provided corresponding to the pixel driving circuits in the TFT driving array layer T1. A cathode layer 114 connecting the multiple light emitting devices OL1, and a first flexible encapsulation layer 141 covering the entire TFT driving array layer T1 may be formed on the flexible substrate 110.

In some embodiments, the TFT driving array layer T1 includes: the driving transistor 113, the first gate metal signal line 111, the first data signal line (not shown), a first inorganic insulating sub-layer 115 located between the flexible substrate 110 and the first gate metal signal line 111, a second inorganic insulating sub-layer 116 located between the first data signal line, and the first gate metal signal line 111. For the first flexible encapsulation layer 141, a stacked moisture-oxygen barrier layer may be included, and it may be a "sandwich" structure of an inorganic insulating layer-organic buffer layer-inorganic insulating layer.

Figure 8:
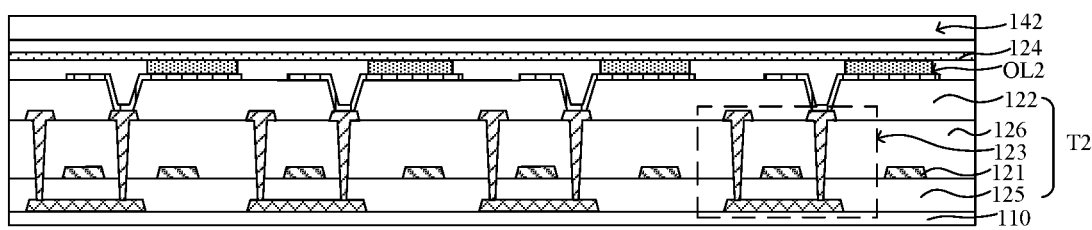
FIG. 8 illustrates a schematic cross-sectional diagram of FIG. 1 taken along line 2b-2b'.

For a specific structure of the second display zone 12, as shown in FIG. 8, a TFT driving array layer T2, multiple light emitting devices OL2 provided corresponding to the pixel driving circuits in the TFT driving array layer T2, a cathode layer 124 connecting the multiple light emitting devices OL2, and a second flexible encapsulation layer 142 covering the entire TFT driving array layer T2 may be formed on the flexible substrate 110.

In some embodiments, the TFT driving array layer T2 includes: the driving transistor 123, a second gate metal signal line 121, and a second data signal line (not shown), a third inorganic insulating sub-layer 125 located between the flexible substrate 110 and the second gate metal signal line 121, a fourth inorganic insulating sub-layer 126 located between the second data signal line, and the second gate metal signal line 121. For the second flexible encapsulation layer 142, a stacked moisture-oxygen barrier layer may be included, and it may be a "sandwich" structure of an inorganic insulating layer-organic buffer layer-inorganic insulating layer. The first flexible encapsulation layer 141 and the second flexible encapsulation layer 142 may be formed by the same process step.

Figure 9:
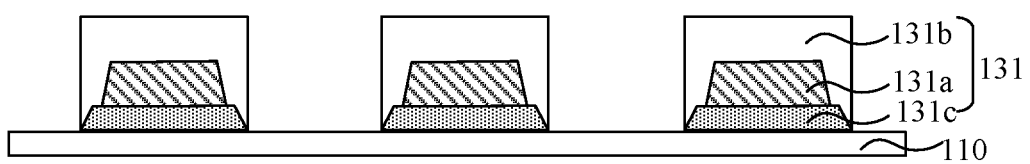
FIG. 9 illustrates another schematic cross-sectional diagram of FIG. 1 taken along line 33'.

As shown in FIG. 9, based on the above implementations, the present disclosure also includes a specific structure of the bending-resistant portion 131 in the other non-display zone 13. The technical details in this embodiment that are the same as those in the above embodiments, and are not described herein for conciseness and brevity. The technical points in this embodiment will be described below. In the present embodiment, the bending-resistant portion 131 includes the first inorganic bedding portion 131c, the metal portion 131a and the organic buffer portion 131b, which are sequentially stacked. The first inorganic bedding portion 131c is formed by patterning the first inorganic insulating layer covering the flexible substrate 110. The first inorganic insulating layer is patterned to form the first inorganic insulating sub-layer 115, the third inorganic insulating sub-layer 125, and the first inorganic bedding portion 131c. In the present embodiment, by increasing the first inorganic bedding portion 131c, a mismatch between the organic buffer portion 131b and the metal portion 131a is reduced, thereby enhancing the surface adhesion force of the organic buffer portion 131b to the metal portion 131a, which further improves the bending resistance of the non-display zone 13.

Figure 10:
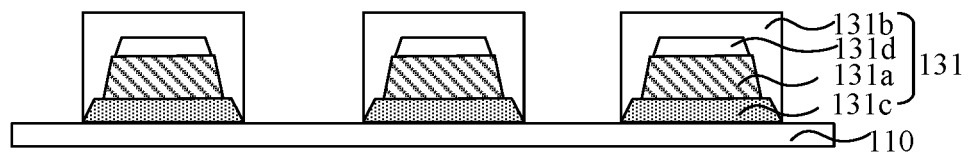
FIG. 10 illustrates a further cross-sectional diagram of FIG. 1 taken along line 33'.

As shown in FIG. 10, based on the above embodiments, the present disclosure also includes another specific structure of the bending-resistant portion 131 in the non-display zone 13. The technical details in this embodiment that are the same as those in the above embodiments are not described herein again. The technical points in this embodiment will be described below.

In the present embodiment, the bending-resistant portion 131 includes a first inorganic bedding portion 131c, a metal portion 131a, a second inorganic bedding portion 131d, and an organic buffer portion 131b, which are sequentially stacked. The second inorganic bedding portion 131d is formed by patterning the second inorganic insulating layer. The second inorganic insulating layer is patterned to form the second inorganic insulating sub-layer 116, the fourth inorganic insulating sub-layer 126, and the second inorganic bedding portion 131d. In the present embodiment, mismatching between the organic buffer portion 131b and the metal portion 131a is further reduced by increasing the second inorganic bedding portion 131d, thereby enhancing the surface adhesion force of the organic buffer portion 131b to the metal portion 131a, which further improves the bending resistance of the non-display zone 13.

It should be noted that, in the above embodiments, the metal portion 131a of the bending-resistant portion 131 may also be formed by a metal layer patterned to form a data signal line in the display zone, or formed by patterning a metal layer located between the data signal line and the gate signal line, or formed by other auxiliary metal layers.

In addition, in order to further improve the bending resistance of the non-display zone 13, in one embodiment of the present disclosure, the first display zone 11 and the second display zone 12 are separately encapsulated and no encapsulation layer structure is provided in the non-display zone 13, such that it is possible to avoid or at least reduce the internal stress which is caused by the encapsulation layer structure affecting the bending performance of the non-display zone 13.

Figure 11:
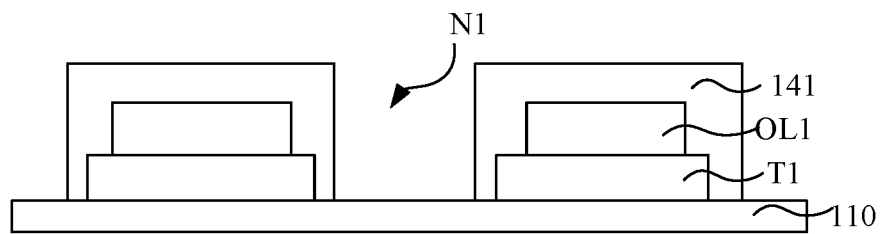
FIG. 11 illustrates a schematic cross-sectional diagram of FIG. 1 taken along line 1a-1a'.
Figure 12:
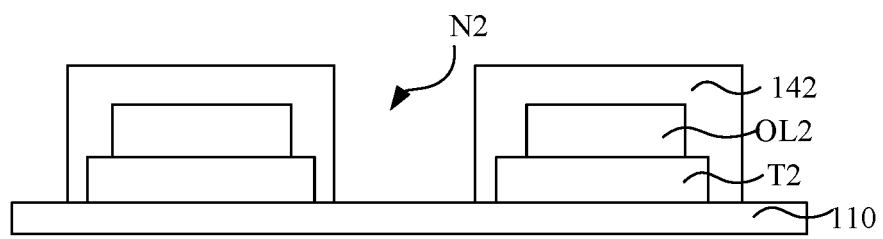
FIG. 12 illustrates a schematic cross-sectional diagram of FIG. 1 taken along line 2a-2a'.

As shown in FIG. 7 to FIG. 12, the first display zone 11 includes a first flexible encapsulation layer 141; the second display zone 12 includes a second flexible encapsulation layer 142, the first flexible encapsulation layer 141 and the second flexible encapsulation layer 142 are independent structures. In addition, as shown in FIG. 11 and FIG. 12, in regions corresponding to the first hollow zone N1 on the first display zone 11 and the second hollow zone N2 on the second display zone 12, no encapsulation layer structure is provided either, resulting in an improvement in the light transmittance of the hollow zone, thereby achieving that the light sensing device can be provided in the hollow zone.

Figure 19:
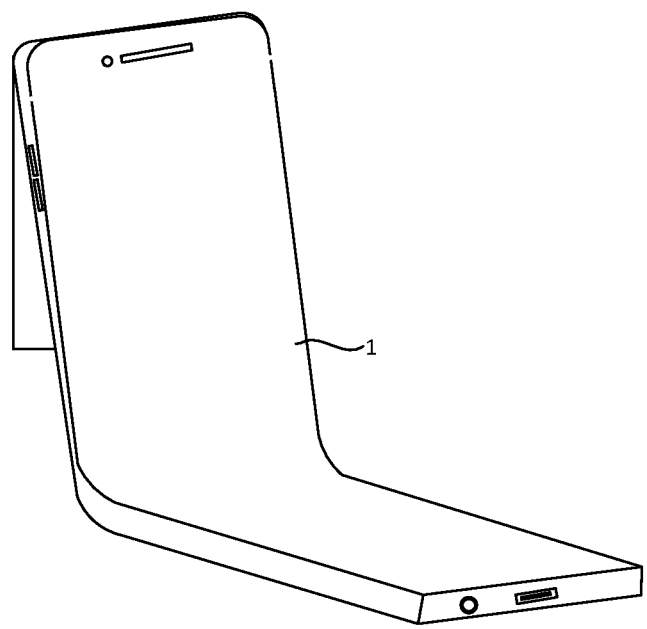
FIG. 19 illustrates a structural schematic diagram of a display device according to an embodiment of the present disclosure.

As shown in FIG. 19, an embodiment of the present disclosure further provides a display device. FIG. 19 is a structural schematic diagram of a display device according to an embodiment of the present disclosure, and the display device includes the display panel 1 described above. The specific structure of the display panel 1 has been described in detail in the above embodiments and will not be described herein again. The display device shown in FIG. 19 is merely illustrative, and the display device may be any electronic device having a display function such as a mobile phone, a tablet computer, a laptop computer, an electronic paper book, or a television.

Since the display device provided by the embodiments of the present disclosure includes the display panel described above, when adopting this display device, by providing a hollow zone in both the first display zone and the second display zone of the display panel, the occupancy ratio of the non-display zones of the two is reduced, thereby increasing the occupancy ratio of the effective display zone and realizing a double-sided full screen display. In addition, in order to further enhance the bending resistance of the flexible display panel, multiple bending-resistant portions are provided in the non-display zone and the bending-resistant portions may be formed in synchronization with the metal traces, the organic film layer or/and the inorganic film layer in the first display zone and the second display zone, so that the manufacturing process steps of the bending-resistant portions can be greatly reduced.

The above-described embodiments are merely example embodiments of the present disclosure but not intended to provide any limitation. Any modification, equivalent substitution, improvement, etc., made within the spirit and scope of the present disclosure is intended to be included within the scope of the present disclosure.

What is claimed is:

1. A flexible display panel, comprising:
a first display zone;
a second display zone; and
a non-display zone located between the first display zone and the second display zone, the non-display zone being an integral physical structure having no hollow portion;
wherein after the flexible display panel is bent along a folding axis extending along a first direction defined in the non-display zone, a light-emitting surface of the first display zone and a light-emitting surface of the second display zone face away from each other;
the first display zone has, at a side close to the non-display zone, a first hollow zone connected to the non-display zone;
the second display zone has, at a side close to the non-display zone, a second hollow zone connected to the non-display zone; and
each of the first hollow zone and the second hollow zone are provided for arrangement of sensors and having no display function,
wherein the folding axis comprises a first folding axis and a second folding axis, wherein the first folding axis and the second folding axis extend in the first direction and are parallel to each other; and
the first display zone is bendable along the first folding axis, and the second display zone is bendable along the second folding axis,
wherein the non-display zone comprises a plurality of bending-resistant portions, and each of the plurality of bending-resistant portions comprises a metal portion and an organic buffer portion covering the metal portion; and
each of the plurality of bending-resistant portions extends in a second direction, the second direction being substantially perpendicular to the first direction,
wherein the flexible display panel further comprises:
a first metal layer;
a first metal signal line located in the first display zone and configured to provide a driving signal to the first display zone; and
a second metal signal line located in the second display zone and configured to provide a driving signal to the second display zone;
wherein the metal portion, the first metal signal line and the second metal signal line are located in the same first metal layer.

2. The flexible display panel according to claim 1, wherein each of the plurality of bending-resistant portions has a first width W1, and wherein the first width W1 is in a range of 1 µm to 100 µm.

3. The flexible display panel according to claim 2, wherein any adjacent two of the plurality of bending-resistant portions are spaced from each other by a first spacing D1; and
wherein the first spacing D1 is in a range of 1 µm to 10 µm, or the first spacing D1 is substantially equal to the first width W1.

4. The flexible display panel according to claim 1, wherein the metal portion, the first metal signal line, and the second metal signal line have an identical thickness; and
the metal portion, the first metal signal line and the second metal signal line are electrically insulated from one another.

5. The flexible display panel according to claim 4, wherein the first metal layer is a Ti—Al—Ti composite metal layer.

6. The flexible display panel according to claim 1, further comprising: an organic planarization layer, wherein
the organic planarization layer is patterned to form a first organic planarization portion, a second organic planarization portion, and the organic buffer portion;
the first organic planarization portion is located in the first display zone and covers the first metal signal line; and
the second organic planarization portion is located in the second display zone and covers the second metal signal line.

7. The flexible display panel according to claim 6, further comprising: a flexible substrate, and a first inorganic insulating layer covering the flexible substrate, wherein
in each of the plurality of bending-resistant portions, a first inorganic bedding portion formed by patterning the first inorganic insulating layer is disposed; and
the first inorganic bedding portion is located between the metal portion and the flexible substrate.

8. The flexible display panel according to claim 7, further comprising: a second inorganic insulating layer, wherein
in each of the plurality of bending-resistant portions, a second inorganic bedding portion formed by patterning the second inorganic insulating layer is disposed; and
the second inorganic bedding portion is located between the metal portion and the organic buffer portion.

9. The flexible display panel according to claim 1, comprising:
a first flexible encapsulation layer located in the first display zone; and
a second flexible encapsulation layer located in the second display zone, wherein the first flexible encapsulation layer and the second flexible encapsulation layer are mutually independent from each other, and
no encapsulation layer is provided in the non-display zone.

10. The flexible display panel according to claim 1, wherein both the first hollow zone and the second hollow zone are zones having no display function; and
the first hollow zone and the second hollow zone are formed from an opening mask, wherein the opening mask has a first shielding portion, and the first shielding portion has a same pattern as the first hollow zone and the second hollow zone.

11. The flexible display panel according to claim 10, wherein the first hollow zone and the second hollow zone are arranged in mirror symmetry.

12. The flexible display panel according to claim 1, wherein an area of the second display zone is smaller than an area of the first display zone; and
a number of pixel units in a unit area of the second display zone is smaller than a number of pixel units in a unit area of the first display zone.

13. The flexible display panel according to claim 12, wherein an arrangement of pixel units in the second display zone is different from an arrangement of pixel units in the first display zone.

14. The flexible display panel according to claim 1, wherein the first display zone has a virtual folding axis, and the virtual folding axis extends along the first direction;
- the first display zone is in an in-fold state, an out-fold state, or a tiled state along the virtual folding axis; and
- a bending radius of the first display zone along the virtual folding axis is greater than or equal to 1 mm.

15. A display device, comprising a flexible display panel, wherein the flexible display panel comprises:
- a first display zone;
- a second display zone; and
- a non-display zone located between the first display zone and the second display zone, the non-display zone being an integral physical structure having no hollow portion;
- wherein after the flexible display panel is bent along a folding axis extending along a first direction defined in the non-display zone, a light-emitting surface of the first display zone and a light-emitting surface of the second display zone face away from each other;
- the first display zone has, at a side close to the non-display zone, a first hollow zone connected to the non-display zone;
- the second display zone has, at a side close to the non-display zone, a second hollow zone connected to the non-display zone; and
- each of the first hollow zone and the second hollow zone are provided for arrangement of sensors and having no display function,
- wherein the folding axis comprises a first folding axis and a second folding axis, wherein the first folding axis and the second folding axis extend in the first direction and are parallel to each other; and
- the first display zone is bendable along the first folding axis, and the second display zone is bendable along the second folding axis,
- wherein the non-display zone comprises a plurality of bending-resistant portions, and each of the plurality of bending-resistant portions comprises a metal portion and an organic buffer portion covering the metal portion; and
- each of the plurality of bending-resistant portions extends in a second direction, the second direction being substantially perpendicular to the first direction,
- wherein the flexible display panel further comprises:
- a first metal layer;
- a first metal signal line located in the first display zone and configured to provide a driving signal to the first display zone; and
- a second metal signal line located in the second display zone and configured to provide a driving signal to the second display zone;
- wherein the metal portion, the first metal signal line and the second metal signal line are located in the same first metal layer.

* * * * *